United States Patent
Huang et al.

(10) Patent No.: US 11,025,256 B2
(45) Date of Patent: Jun. 1, 2021

(54) FILTER WITH DIRECT CURRENT LEVEL SHIFT AND ASSOCIATED PHASE-LOCKED LOOP CIRCUIT

(71) Applicant: MEDIATEK INC., Hsin-Chu (TW)

(72) Inventors: Yi-Chieh Huang, Hsin-Chu (TW); Sung-Lin Tsai, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/435,568

(22) Filed: Jun. 10, 2019

(65) Prior Publication Data

US 2020/0067515 A1 Feb. 27, 2020

Related U.S. Application Data

(60) Provisional application No. 62/720,160, filed on Aug. 21, 2018.

(51) Int. Cl.
| | |
|---|---|
| H03L 7/093 | (2006.01) |
| H03K 3/03 | (2006.01) |
| H03L 7/089 | (2006.01) |
| H03L 7/091 | (2006.01) |
| H03L 7/099 | (2006.01) |

(52) U.S. Cl.
CPC ........... *H03L 7/093* (2013.01); *H03K 3/0315* (2013.01); *H03L 7/089* (2013.01); *H03L 7/091* (2013.01); *H03L 7/0995* (2013.01); *H03L 2207/06* (2013.01)

(58) Field of Classification Search
CPC .... H03K 3/00; H03K 3/0315; H03L 2207/00; H03L 2207/06; H03L 7/00; H03L 7/087; H03L 7/089; H03L 7/0891; H03L 7/091; H03L 7/093; H03L 7/0995; H03L 7/10; H03L 7/18
USPC ......................................................... 327/156
See application file for complete search history.

(56) References Cited

U.S. PATENT DOCUMENTS

| | | |
|---|---|---|
| 4,752,749 A | 6/1988 | Moger |
| 6,563,389 B1 | 5/2003 | Fischer |
| 2006/0214736 A1 | 9/2006 | Salonen |
| 2008/0074200 A1 | 3/2008 | Cong |
| 2009/0184770 A1* | 7/2009 | Li ....................... H03H 7/0153 330/296 |

(Continued)

FOREIGN PATENT DOCUMENTS

| | | |
|---|---|---|
| WO | 2009/109636 A2 | 9/2009 |
| WO | 2009/109636 A3 | 11/2009 |
| WO | 2009/109636 A4 | 2/2010 |

*Primary Examiner* — Lincoln D Donovan
*Assistant Examiner* — Dave Mattison
(74) *Attorney, Agent, or Firm* — Wolf, Greenfield & Sacks, P.C.

(57) ABSTRACT

A filter includes a filter circuit, a first processing circuit, and a second processing circuit. The filter circuit receives an input signal from an input node of the filter, and converts the input signal into a voltage output. The first processing circuit provides a first control voltage to an output node of the filter according to the voltage output, wherein the first control voltage is derived from an alternating current (AC) component of the voltage output. The second processing circuit provides a second control voltage to the output node of the filter according to the voltage output, wherein the second control voltage is derived from applying DC level shift to a direct current (DC) component of the voltage output.

17 Claims, 6 Drawing Sheets

(56) References Cited

U.S. PATENT DOCUMENTS

| | | | |
|---|---|---|---|
| 2011/0025386 A1* | 2/2011 | Lamanna | H03L 7/093 |
| | | | 327/156 |
| 2012/0146705 A1* | 6/2012 | Den Besten | H03K 17/063 |
| | | | 327/333 |
| 2013/0033527 A1* | 2/2013 | Yen | G09G 3/3696 |
| | | | 345/690 |
| 2014/0021988 A1 | 1/2014 | Zhang | |
| 2014/0085011 A1* | 3/2014 | Choi | H03L 7/099 |
| | | | 331/8 |
| 2019/0207573 A1* | 7/2019 | Stanescu | H03F 3/45475 |
| 2019/0215000 A1* | 7/2019 | Jin | H03L 7/0891 |

* cited by examiner

FILTER WITH DIRECT CURRENT LEVEL SHIFT AND ASSOCIATED PHASE-LOCKED LOOP CIRCUIT

CROSS REFERENCE TO RELATED APPLICATIONS

This application claims the benefit of U.S. provisional application No. 62/720,160, filed on Aug. 21, 2018 and incorporated herein by reference.

BACKGROUND

The present invention relates to a filter design, and more particularly, to a filter with direct current (DC) level shift and an associated phase-locked loop (PLL) circuit.

Phase-locked loop (PLL) circuit is one of the most inevitable necessities in modern electronic systems. For example, PLL circuits can be used in applications of clock generation, time synchronization, clock multiplication, etc. A low-power PLL circuit becomes essential for certain applications. For example, a data center application may require a PLL circuit to operate under a low supply voltage (e.g., 0.8V). Voltage-controlled oscillator (VCO) is a key component of a PLL circuit. To achieve a high all-band power supply rejection ratio (PSRR), a VCO may employ an N-channel metal-oxide-semiconductor field-effect transistor (NMOS) source follower for receiving a control voltage and pass the control voltage to an oscillator. In general, a gate of an NMOS requires 0.6-0.9V to turn on the NMOS. Hence, the NMOS source follower is unable to operate normally under the low supply voltage (e.g., 0.8V). Since an NMOS source follower with a high all-band PSRR cannot be used by a VCO of a PLL circuit that is required to operate under a low supply voltage, a PLL circuit used in a low supply application may have a PSRR issue. Thus, there is a need for a high PSRR PLL circuit that can be used in a low supply application.

SUMMARY

One of the objectives of the claimed invention is to provide a filter with direct current (DC) level shift and an associated phase-locked loop (PLL) circuit.

According to a first aspect of the present invention, an exemplary filter is disclosed. The exemplary filter includes a filter circuit, a first processing circuit, and a second processing circuit. The filter circuit is arranged to receive an input signal from an input node of the loop filter, and convert the input signal into a voltage output. The first processing circuit is arranged to provide a first control voltage to an output node of the loop filter according to the voltage output, wherein the first control voltage is derived from an alternating current (AC) component of the voltage output. The second processing circuit is arranged to provide a second control voltage to the output node of the loop filter according to the voltage output, wherein the second control voltage is derived from applying DC level shift to a direct current (DC) component of the voltage output.

According to a second aspect of the present invention, an exemplary phase-locked loop (PLL) circuit is disclosed. The PLL circuit includes a phase-frequency detector (PFD) circuit, a charge pump (CP) circuit, a controllable oscillator circuit, a feedback circuit, and a loop filter. The PFD circuit is arranged to generate an error output by comparing a reference clock signal with a feedback clock signal. The CP circuit is arranged to generate a CP output according to the error output. The controllable oscillator circuit is arranged to generate an output clock signal according to a control voltage, wherein the control voltage comprises a first control voltage and a second control voltage. The feedback circuit is arranged to generate the feedback clock signal according to the output clock signal. The loop filter is arranged to generate the control voltage according to the CP output, wherein an input node of the loop filter is arranged to receive the CP output from the CP circuit, and an output node of the loop filter is arranged to output the control voltage to the controllable oscillator circuit. The loop filter includes a loop filter circuit, a first processing circuit, and a second processing circuit. The loop filter circuit is arranged to convert the CP output into a voltage output. The first processing circuit is arranged to provide the first control voltage to the output node of the loop filter according to the voltage output, wherein the first control voltage is derived from an alternating current (AC) component of the voltage output. The second processing circuit is arranged to provide the second control voltage to the output node of the loop filter according to the voltage output, wherein the second control voltage is derived from applying DC level shift to a direct current (DC) component of the voltage output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
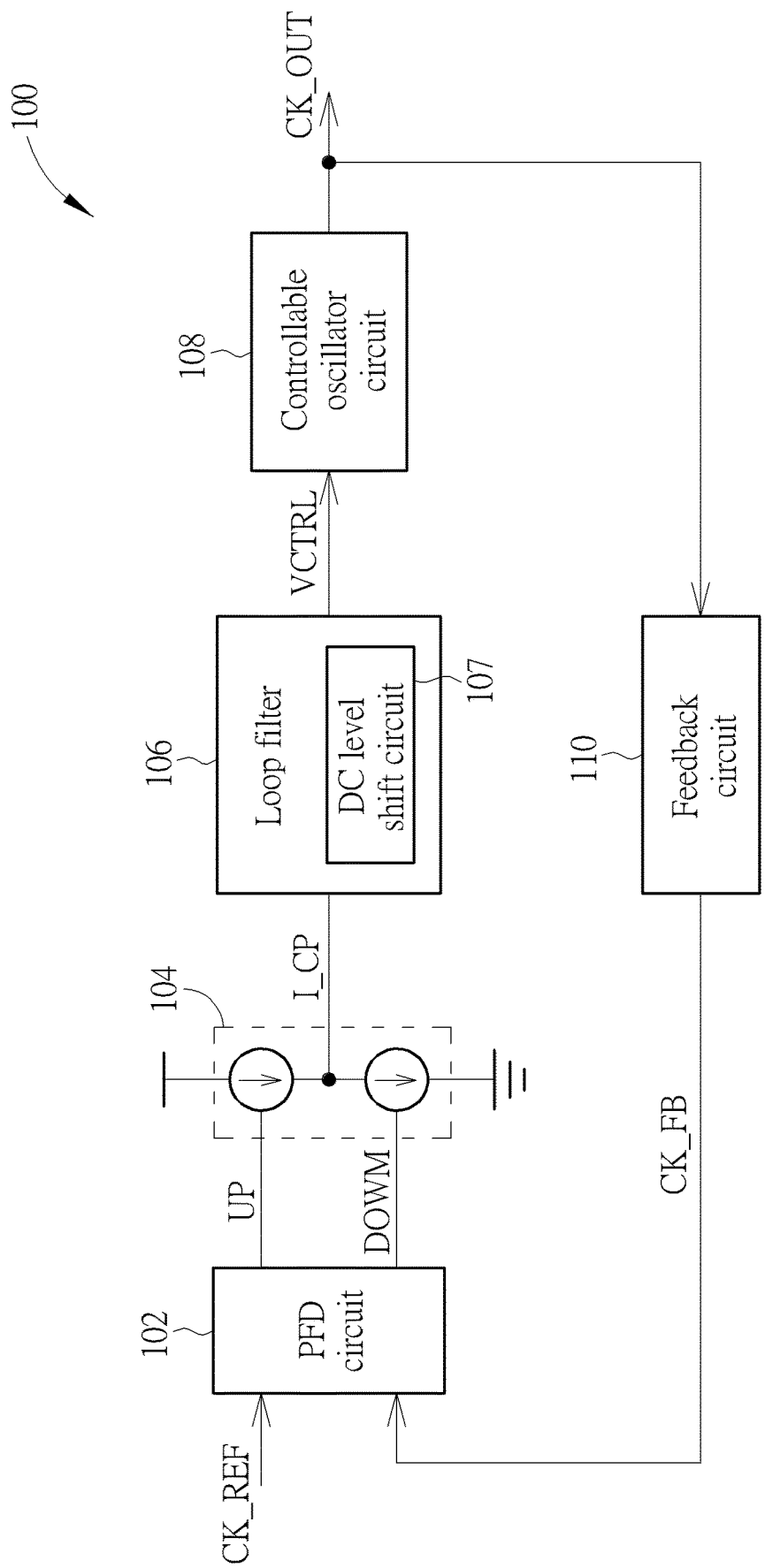
FIG. 1 is a diagram illustrating a phase-locked loop (PLL) circuit according to an embodiment of the present invention.

FIG. 1 is a diagram illustrating a phase-locked loop (PLL) circuit according to an embodiment of the present invention. The PLL circuit 100 includes a phase-frequency detector (PFD) circuit 102, a charge pump (CP) circuit 104, a loop filter 106, a controllable oscillator circuit 108, and a feedback circuit 110. The PFD circuit 102 is arranged to generate an error output by comparing a reference clock signal CK_REF with a feedback clock signal CK_FB, where the error output includes an UP signal and a DOWN signal. The CP circuit 104 is arranged to generate a CP output I_CP according to the error output {UP, DOWN}. The loop filter 106 is arranged to generate a control voltage VCTRL according to the CP output I_CP. The controllable oscillator circuit 108 is arranged to generate an output clock signal CK_OUT according to the control voltage VCTRL, where the magnitude of the control voltage VCTRL decides a frequency of the output clock signal CK_OUT. For example, the controllable oscillator circuit 108 may be a voltage-controlled oscillator (VCO). The feedback circuit 110 is arranged to generate the feedback clock signal CK_FB according to the output clock signal CK_OUT. For example, the feedback circuit 110 may be a frequency divider such as a multi-modulus divider (MMD).

Figure 2:
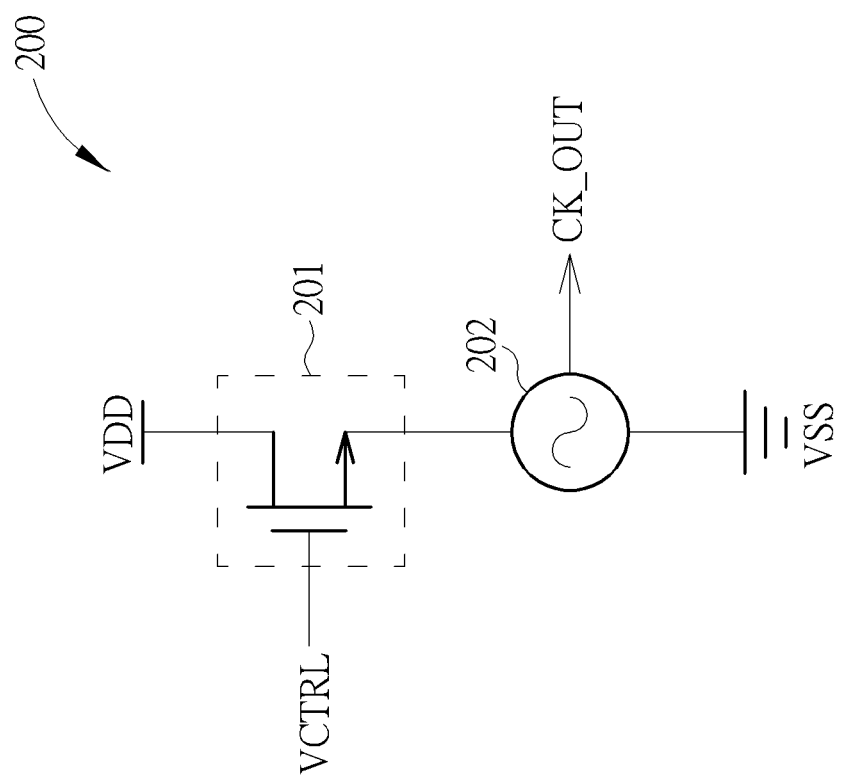
FIG. 2 is a diagram illustrating a voltage-controlled oscillator (VCO) according to an embodiment of the present invention.

FIG. 2 is a diagram illustrating a voltage-controlled oscillator (VCO) according to an embodiment of the present invention. The controllable oscillator circuit 108 shown in FIG. 1 may be implemented using the VCO 200 shown in FIG. 2. The VCO 200 includes an NMOS 201 and a voltage-controlled ring oscillator 202. A gate of the NMOS 201 is arranged to receive the control voltage VCTRL. A drain of the NMOS 201 is coupled to a reference voltage (e.g., supply voltage) VDD. The voltage-controlled ring oscillator 202 is coupled between a source of the NMOS 201 and another reference voltage (e.g., ground voltage) VSS. As shown in FIG. 2, the NMOS 201 has a common drain configuration, and acts as a source follower. Hence, the voltage-controlled ring oscillator 202 is controlled by the control voltage VCTRL through the NMOS 201.

In a case where the controllable oscillator circuit 108 is implemented using the VCO 200, the PLL circuit 100 is a ring PLL circuit. The gate of the NMOS 201 requires 0.6-0.9V to turn on the NMOS 201. When the ring PLL circuit is used in a low power application that operates under a low supply voltage (e.g., 0.8V), the present invention proposes using the loop filter 106 with a direct current (DC) level shift circuit 107 to ensure a normal operation of the NMOS 201. Due to inherent characteristics, the NMOS 201 is less sensitive to the voltage variation. Hence, the controllable oscillator circuit 108 implemented using the VCO 200 has a high all-band PSRR. To put it simply, a high PSRR ring PLL for a low supply application can be achieved due to the proposed loop filter 106 with the DC level shift circuit 107.

Figure 3:
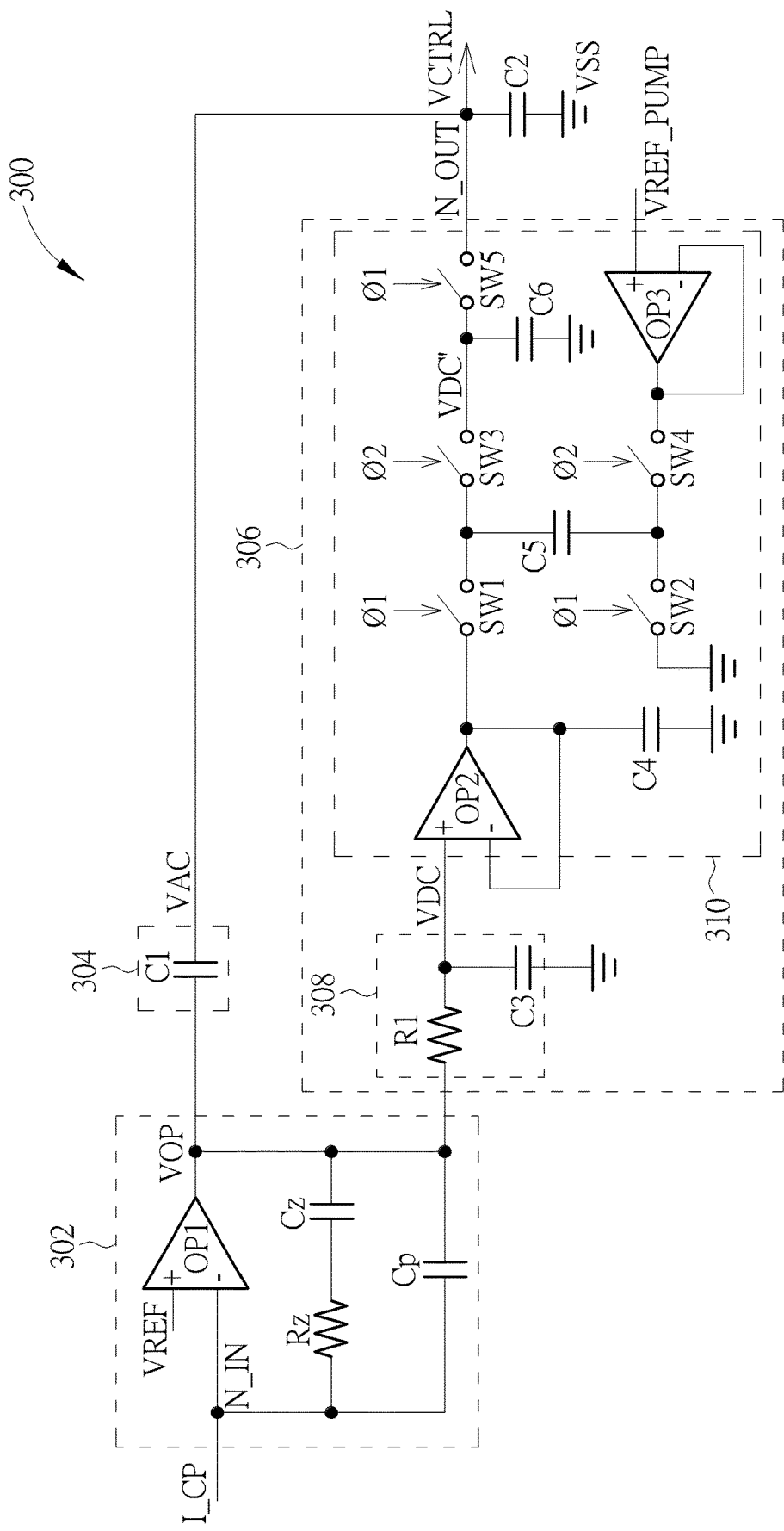
FIG. 3 is a diagram illustrating a loop filter with a DC level shift circuit according to an embodiment of the present invention.

FIG. 3 is a diagram illustrating a loop filter with a DC level shift circuit according to an embodiment of the present invention. The loop filter 106 shown in FIG. 1 may be implemented using the loop filter 300 shown in FIG. 3. The loop filter 300 includes a loop filter circuit 302, a first processing circuit 304, a second processing circuit 306, and an output capacitor C2. An input node N_IN of the loop filter 300 is arranged to receive an input signal (e.g., CP output I_CP of CP circuit 104), and an output node N_OUT of the loop filter 300 is arranged to provide a voltage output (e.g., control voltage VCTRL of controllable oscillator circuit 108). The output capacitor C2 is coupled between the output node N_OUT of the loop filter 300 and a reference voltage (e.g., ground voltage) VSS.

In this embodiment, the loop filter circuit 302 is an active loop filter that includes an operational amplifier OP1, a resistor Rz, and two capacitors Cz and Cp. The loop filter circuit 302 converts the input signal (e.g., CP output I_CP of CP circuit 104) into a voltage output VOP. As shown in FIG. 3, a non-inverting input node (+) of the operational amplifier OP1 is arranged to receive a predetermined voltage VREF, an inverting node (−) of the operational amplifier OP1 is arranged to receive the input signal (e.g., CP output I_CP of CP circuit 104), and an output node of the operational amplifier OP1 is arranged to output the voltage output VOP. A first end of the resistor Rz is coupled to the inverting input node (−) of the operational amplifier OP1, a first end of the capacitor Cz is coupled to a second end of the resistor Rz, a first end of the capacitor Cp is coupled to the inverting input node (−) of the operational amplifier OP1, and a second end of the capacitor Cp is coupled to the output node of the operational amplifier OP1. It should be noted that the circuit architecture of the loop filter circuit 302 is for illustrative purposes only, and is not meant to be a limitation of the present invention. Alternatively, the loop filter circuit 302 may be implemented using other circuit architecture.

The first processing circuit 304 is located at a proportional path that is used for passing the AC component VAC of the voltage output VOP. The second processing circuit 306 is located at an integral path that is used for passing the DC component VDC of the voltage output VOP. In this embodiment, the control voltage VCTRL includes a first control voltage provided by the first processing circuit 304 and a second control voltage provided by the second processing circuit 306, where the first control voltage is derived from an alternating current (AC) component VAC of the voltage output VOP, and the second control voltage is derived from applying DC level shift to a direct current (DC) component VDC of the voltage output VOP. As shown in FIG. 3, the control voltage VCTRL changes in response to the first control voltage (which is set by the AC component VAC) delivered through a fast path, and changes in response to the second control voltage (which is set by a level-shifted DC component VDC') delivered through a slow path.

The first processing circuit 304 includes an AC coupling capacitor C1 having a first end arranged to receive the voltage output VOP and a second end coupled to the output node N_OUT of the loop filter 300. The AC coupling capacitor C1 is arranged to extract the AC component VAC from the voltage output VOP of the loop filter circuit 302, and pass the AC component VAC to the output node N_OUT of the loop filter 300 for acting as the first control voltage. Specifically, the proportional path uses AC coupling for achieving a fast response.

The second processing circuit 306 is arranged to act as a DC level shift circuit (e.g., DC level shift circuit 107 shown in FIG. 1), and includes a low-pass filter 308 and a voltage level shifter 310. The low-pass filter 308 includes a resistor R1 and a capacitor C2, and is arranged to extract the DC component VDC from the voltage output VOP of the loop filter circuit 302. The voltage level shifter 310 includes operational amplifiers OP2, OP3, switch circuits SW1, SW2, SW3, SW4, SW5, and capacitors C4, C5, C6.

The operational amplifier OP2 is configured to act as a unity-gain buffer. Hence, a non-inverting input node (+) of the operational amplifier OP2 is arranged to receive the DC component VDC from the low-pass filter 308, and an inverting input node (−) of the operational amplifier OP2 is coupled to an output node of the operational amplifier OP2. An output of the operational amplifier OP2 is set by the DC component VDC due to inherent characteristics of the unity-gain buffer.

A first end of the capacitor C4 is coupled to the output node of the operational amplifier OP2, and a second end of the capacitor C4 is coupled to the reference voltage (e.g., ground voltage) VSS. A first end of the switch circuit SW1 is coupled to the output node of the operational amplifier OP2, and a second end of the switch circuit SW1 is coupled to a first end of the capacitor C5. A first end of the switch circuit SW2 is coupled to the reference voltage (e.g., ground voltage) VSS, and a second end of the switch circuit SW2 is coupled to a second end of the capacitor C5. A first end of the switch circuit SW3 is coupled to the first end of the capacitor C5, and a second end of the switch circuit SW3 is coupled to a first end of the capacitor C6. A second end of the capacitor C6 is coupled to the reference voltage (e.g., ground voltage) VSS. A first end of the switch circuit SW4 is coupled to the second end of the capacitor C5, and a second end of the switch circuit SW4 is coupled to an output node of the operational amplifier OP3.

The operational amplifier OP3 is configured to act as a unity-gain buffer. Hence, a non-inverting input node (+) of the operational amplifier OP3 is arranged to receive a predetermined voltage VREF_PUMP, and the output node of the operational amplifier OP3 is coupled to an inverting input node (−) of the operational amplifier OP3. An output of the operational amplifier OP3 is set by the predetermined voltage VREF_PUMP due to inherent characteristics of the unity-gain buffer. A first end of the switch circuit SW5 is coupled to the first end of the capacitor C6, and a second end of the switch circuit SW5 is coupled to the output node N_OUT of the loop filter 300.

In this embodiment, a charge pumping technique is employed by the second processing circuit 306. Specifically, the integral path without latency requirement uses the charge pumping technique for achieving the DC level shift operation. In accordance with the charge pumping technique, the on/off state of each of switch circuits SW1, SW2, and SW5 is determined by one switch control signal Ø1, and the on/off state of each of switch circuits SW3 and SW4 is determined by another switch control signal Ø2. The switch control signals Ø1 and Ø2 are properly set to ensure that switch circuits SW1, SW2, and SW5 are switched on while switch circuits SW3 and SW4 are switched off and switch circuits SW3 and SW4 are switched on while switch circuits SW1, SW2, and SW5 are switched off.

Figure 4:
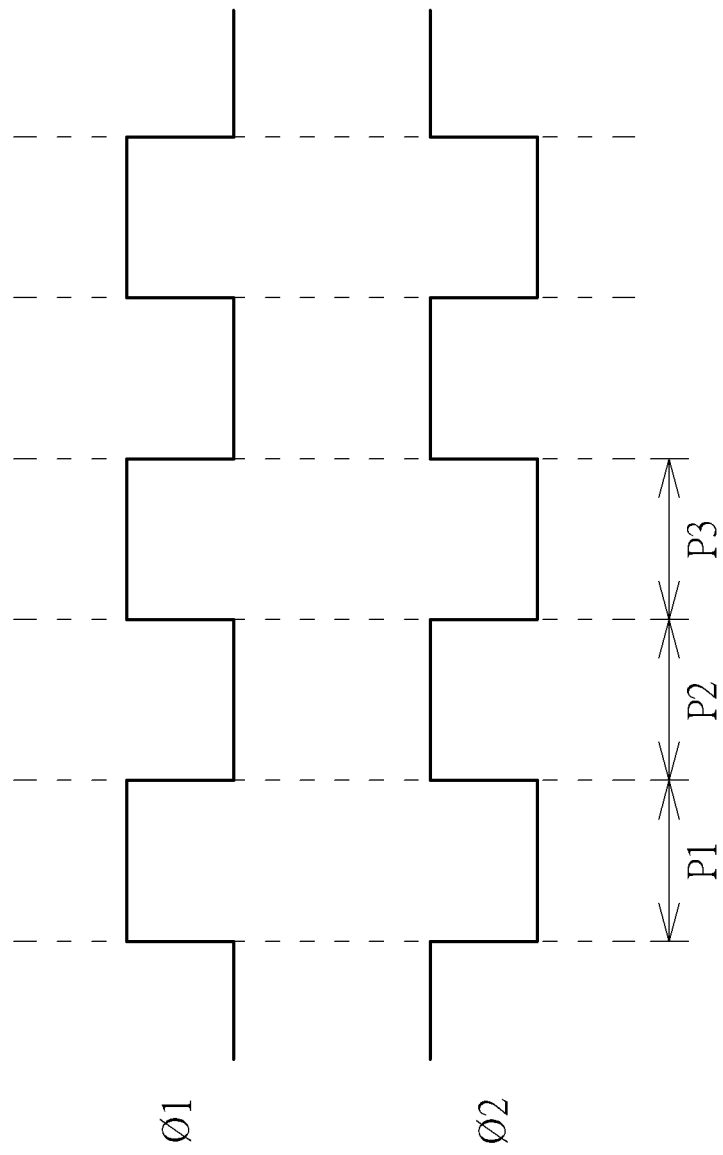
FIG. 4 is a diagram illustrating waveforms of switch control signals Ø1 and Ø2 according to an embodiment of the present invention.

FIG. 4 is a diagram illustrating waveforms of switch control signals Ø1 and Ø2 according to an embodiment of the present invention. The switch circuits SW1, SW2, and SW5 are switched on during a first period P1 and a third period P3, and are switched off during a second period P2. The switch circuits SW3 and SW4 are switched off during the first period P1 and the third period P3, and are switch on during the second period P2. It should be noted that the first period P1 does not overlap the second period P2, and the second period P2 does not overlap the third period P3. Hence, the switch circuits SW1-SW5 are not switched on at the same time.

Figure 5:
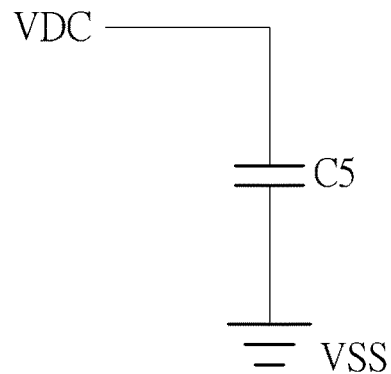
FIG. 5 is a diagram illustrating a first phase of a DC level shift operation performed by the second processing circuit shown in FIG. 3.

FIG. 5 is a diagram illustrating a first phase of a DC level shift operation performed by the second processing circuit 306 shown in FIG. 3. When the switch circuits SW1 and SW2 are switched on and the switch circuits SW3 and SW4 are switched off during the first period P1, the DC component VDC of the voltage output VOP is applied to the first end of the capacitor C5, and the reference voltage (e.g., ground voltage) VSS is applied to the second end of the capacitor C5. Hence, at the end of the first period P1, a voltage drop (VDC−VSS) across the capacitor C5 is established.

Figure 6:
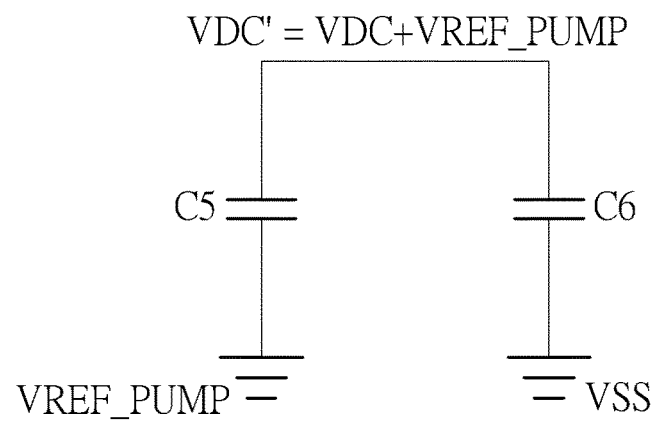
FIG. 6 is a diagram illustrating a second phase of the DC level shift operation performed by the second processing circuit shown in FIG. 3.

FIG. 6 is a diagram illustrating a second phase of the DC level shift operation performed by the second processing circuit 306 shown in FIG. 3. When the switch circuits SW1, SW2 and SW5 are switched off and the switch circuits SW3 and SW4 are switched on during the second period P2, the predetermined voltage VREF_PUMP is applied to the second end of the capacitor C5, thereby pumping the voltage level at the first end of the capacitor C5 from VDC to VDC', where VDC'=VDC+VREF_PUMP. At the end of the second period P2, a voltage drop (VDC+VREF_PUMP−VSS) across the capacitor C6 is established.

Figure 7:
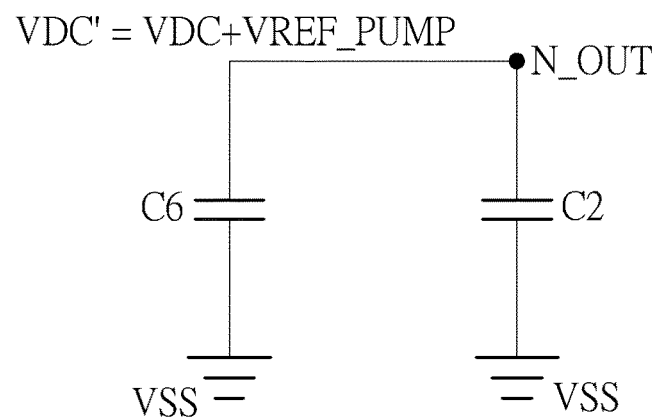
FIG. 7 is a diagram illustrating a third phase of the DC level shift operation performed by the second processing circuit shown in FIG. 3.

FIG. 7 is a diagram illustrating a third phase of the DC level shift operation performed by the second processing circuit 306 shown in FIG. 3. When the switch circuit SW5 is switched on and the switch circuits SW3 and SW4 are switched off during the third period P3, the second control voltage VDC' is applied to the output node N_OUT of the loop filter 300. Suppose that the DC component VDC of the voltage output VOP is 0.6V and the predetermined voltage VREF_PUMP is 0.3V, the second control voltage VDC' provided to the output node N_OUT of the loop filter 300 is 0.9V. In this way, an NMOS source follower with a high all-band PSRR can be used by the controllable oscillator circuit 108 in the PLL circuit 100 that is required to operate under a low supply voltage (e.g., 0.8V).

In this embodiment, a voltage level at the first end of the capacitor C5 is not passed to the output node N_OUT of the loop filter 300 during the second period P2, thereby preventing the control voltage VCTRL from being affected by the time-varying voltage level at the first end of the capacitor C5 before the voltage level at the first end of the capacitor C5 finally reaches a steady-state level-shifted voltage VDC'. However, this is for illustrative purposes only, and is not meant to be a limitation of the present invention. Alternatively, the capacitor C6 and the switch circuit SW5 may be omitted, depending upon actual design consideration.

Figure 8:
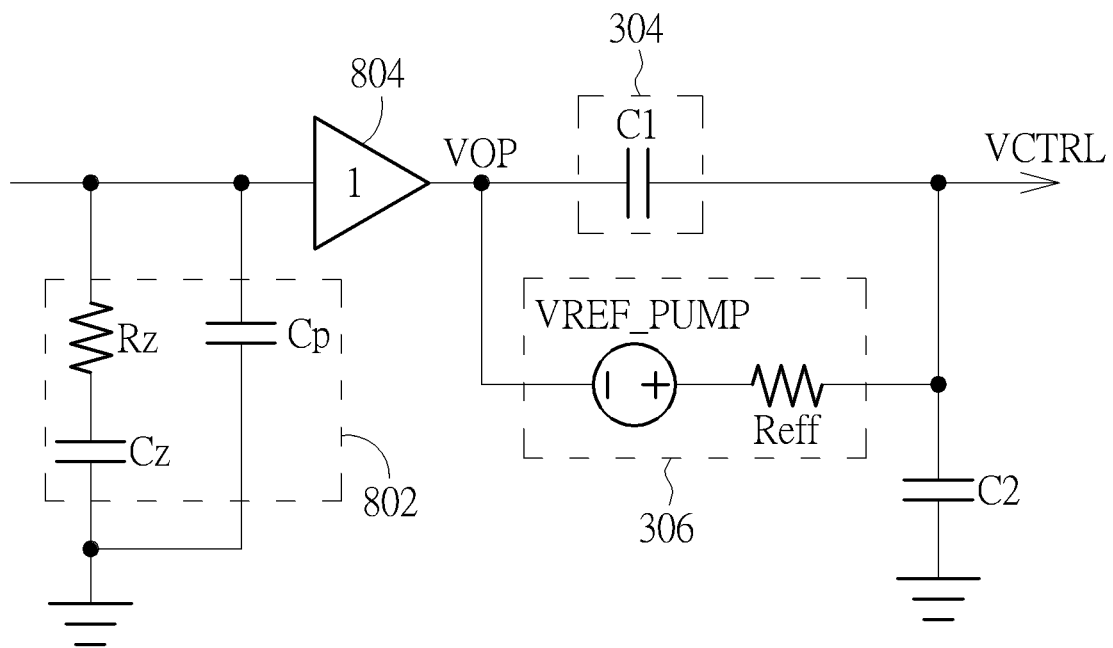
FIG. 8 is a diagram illustrating an equivalent circuit of the loop filter shown in FIG. 3.

FIG. 8 is a diagram illustrating an equivalent circuit of the loop filter 300 shown in FIG. 3. The loop filter circuit 302 is equivalent to a combination of a passive loop filter 802 and an active gate 804. The charge pumping behavior of the second processing circuit 306 is equivalent to a resistor $R_{eff}$. The resistance value of the resistor $R_{eff}$ is equal to $$\frac{1}{R_{ref} * C_{pump}},$$

where $R_{ref}$ represents a charge pumping frequency, and $C_{pump}$ represents a capacitance value of a charge pumping capacitor. Since the active gate 804 has a unity gain, the loop filter 300 may be treated as a passive loop filter with DC level shift.

Figure 9:
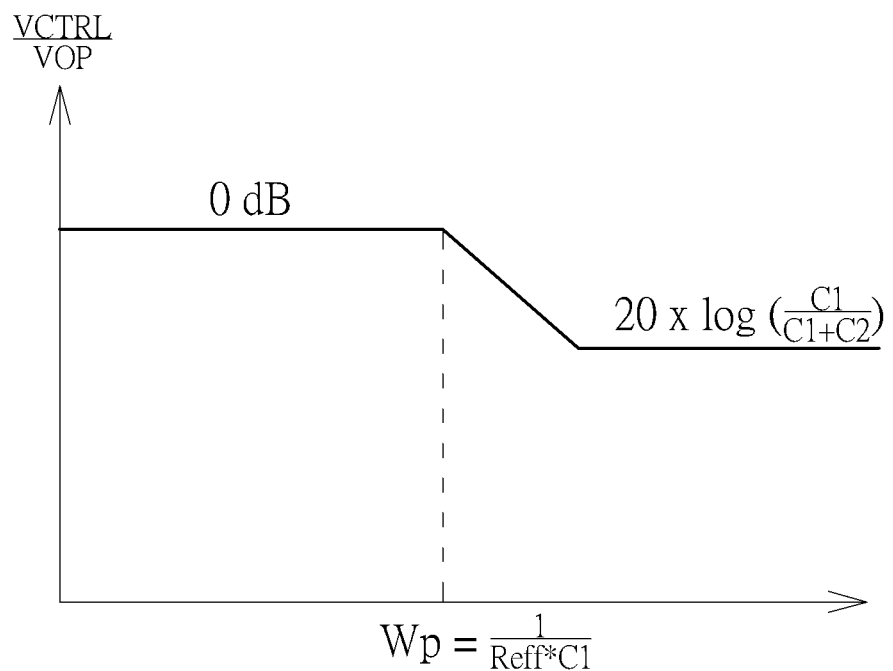
FIG. 9 is a diagram illustrating an open-loop transfer function of the loop filter shown in FIG. 3.

FIG. 9 is a diagram illustrating an open-loop transfer function of the loop filter 300 shown in FIG. 3. The corner frequency of the transfer function is equal to the pole frequency $W_p$, where $$W_p = \frac{1}{R_{eff} * C1}.$$

In some embodiments of the present invention, the capacitance value of the AC coupling capacitor C1 is not smaller than the capacitance value of the capacitor C2. For example, the capacitance value of the AC-coupling capacitor C1 is much larger than the capacitance value of the capacitor C2 (i.e., C1>>C2). Hence, the AC coupling capacitor C1 has no impact on the loop characteristics, and the loop filter 300 can be treated as an all-pass filter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter comprising:
a filter circuit, arranged to receive an input signal from an input node of the filter, and convert the input signal into a voltage output;
a first processing circuit, arranged to provide a first control voltage to an output node of the filter according to the voltage output, wherein the first control voltage is derived from an alternating current (AC) component of the voltage output, and the first control voltage changes in response to the AC component of the voltage output; and
a second processing circuit, arranged to provide a second control voltage to the output node of the filter according to the voltage output, wherein the second control voltage is derived from applying DC level shift to a direct current (DC) component of the voltage output, and said DC level shift is arranged to increase a voltage level of the DC component of the voltage output,
wherein the voltage output comprises both the AC component and the DC component, and the first processing circuit extracts the AC component from the voltage output.

2. The filter of claim 1, wherein the first processing circuit comprises:
an AC coupling capacitor, having a first end arranged to receive the voltage output and a second end coupled to the output node of the filter, wherein the AC coupling capacitor is arranged to extract the AC component from the voltage output, and pass the AC component to the output node of the filter for acting as the first control voltage.

3. The filter of claim 1, wherein the second processing circuit comprises:
a low-pass filter, arranged to extract the DC component from the voltage output; and
a voltage level shifter, arranged to generate the second control voltage by shifting a voltage level of the DC component that is output from the low-pass filter, and pass the second control voltage to the output node of the filter.

4. The filter of claim 3, wherein the voltage level shifter comprises:
a first operational amplifier, having a non-inverting input node, an inverting input node, and an output node, wherein the non-inverting input node of the first operational amplifier is arranged to receive the DC component from the low-pass filter, and the output node of the first operational amplifier is coupled to the inverting input node of the first operational amplifier;
a first capacitor, having a first end and a second end, wherein the first end of the first capacitor is coupled to the output node of the first operational amplifier, and the second end of the first capacitor is coupled to a reference voltage;
a second capacitor, having a first end and a second end;
a second operational amplifier, having a non-inverting input node, an inverting input node, and an output node, wherein the non-inverting input node of the second operational amplifier is arranged to receive a predetermined voltage, and the output node of the second operational amplifier is coupled to the inverting input node of the second operational amplifier;
a first switch circuit, having a first end and a second end, wherein the first end of the first switch circuit is coupled to the output node of the first operational amplifier, and the second end of the first switch circuit is coupled to the first end of the second capacitor;
a second switch circuit, having a first end and a second end, wherein the first end of the second switch circuit is coupled to the reference voltage, and the second end of the second switch circuit is coupled to the second end of the second capacitor;
a third switch circuit, having a first end and a second end, wherein the first end of the third switch circuit is coupled to the first end of the second capacitor, and the second end of the third switch circuit is arranged to output the second control voltage; and
a fourth switch circuit, having a first end and a second end, wherein the first end of the fourth switch circuit is coupled to the second end of the second capacitor, and the second end of the fourth switch circuit is coupled to the output node of the second operational amplifier.

5. The filter of claim 4, wherein the first switch circuit and the second switch circuit are switched on during a first period and are switched off during a second period; the third switch circuit and the fourth switch circuit are switched on during the second period and are switched off during the first period; and the second period does not overlap the first period.

6. The filter of claim 4, wherein the voltage level shifter further comprises:
a third capacitor, having a first end and a second end, wherein the first end of the third capacitor is coupled to the second end of the third switch circuit, and the second end of the third capacitor is coupled to the reference voltage; and
a fifth switch circuit, having a first end and a second end, wherein the first end of the fifth switch circuit is coupled to the first end of the third capacitor, and the second end of the fifth switch circuit is coupled to the output node of the filter.

7. The filter of claim 6, wherein the first switch circuit, the second switch circuit and the fifth switch circuit are switched on during a first period and are switched off during a second period; the third switch circuit and the fourth switch circuit are switched on during the second period and are switched off during the first period; and the second period does not overlap the first period.

8. The filter of claim 1, wherein the filter circuit comprises:
an operational amplifier, having a non-inverting input node, an inverting input node, and an output node, wherein the non-inverting input node is arranged to receive a predetermined voltage, the inverting input node is arranged to receive the input signal, and the output node is arranged to output the voltage output;

a resistor, having a first end and a second end, wherein the first end of the resistor is coupled to the inverting input node of the operational amplifier;

a first capacitor, having a first end and a second end, wherein the first end of the first capacitor is coupled to the second end of the resistor, and the second end of the first capacitor is coupled to the output node of the operational amplifier; and a second capacitor, having a first end and a second end, wherein the first end of the second capacitor is coupled to the inverting input node of the operational amplifier, and the second end of the second capacitor is coupled to the output node of the operational amplifier.

9. A phase-locked loop (PLL) circuit comprising:

a phase-frequency detector (PFD) circuit, arranged to generate an error output by comparing a reference clock signal with a feedback clock signal;

a charge pump (CP) circuit, arranged to generate a CP output according to the error output;

a controllable oscillator circuit, arranged to generate an output clock signal according to a control voltage, wherein the control voltage comprises a first control voltage and a second control voltage;

a feedback circuit, arranged to generate the feedback clock signal according to the output clock signal; and a loop filter, arranged to generate the control voltage according to the CP output, wherein an input node of the loop filter is arranged to receive the CP output from the CP circuit, an output node of the loop filter is arranged to output the control voltage to the controllable oscillator circuit, and the loop filter comprises:

a loop filter circuit, arranged to convert the CP output into a voltage output;

a first processing circuit, arranged to provide the first control voltage to the output node of the loop filter according to the voltage output, wherein the first control voltage is derived from an alternating current (AC) component of the voltage output, and the first control voltage changes in response to the AC component of the voltage output; and a second processing circuit, arranged to provide the second control voltage to the output node of the loop filter according to the voltage output, wherein the second control voltage is derived from applying DC level shift to a direct current (DC) component of the voltage output, and said DC level shift is arranged to increase a voltage level of the DC component of the voltage output, wherein the voltage output comprises both the AC component and the DC component, and the first processing circuit extracts the AC component from the voltage output.

10. The PLL circuit of claim 9, wherein the first processing circuit comprises:

an AC coupling capacitor, having a first end arranged to receive the voltage output and a second end coupled to the output node of the loop filter, wherein the AC coupling capacitor is arranged to extract the AC component from the voltage output, and pass the AC component to the output node of the loop filter for acting as the first control voltage.

11. The PLL circuit of claim 9, wherein the second processing circuit comprises:

a low-pass filter, arranged to extract the DC component from the voltage output; and a voltage level shifter, arranged to generate the second control voltage by shifting a voltage level of the DC component that is output from the low-pass filter, and pass the second control voltage to the output node of the loop filter.

12. The PLL circuit of claim 11, wherein the voltage level shifter comprises:

a first operational amplifier, having a non-inverting input node, an inverting input node, and an output node, wherein the non-inverting input node of the first operational amplifier is arranged to receive the DC component from the low-pass filter, and the output node of the first operational amplifier is coupled to the inverting input node of the first operational amplifier;

a first capacitor, having a first end and a second end, wherein the first end of the first capacitor is coupled to the output node of the first operational amplifier, and the second end of the first capacitor is coupled to a reference voltage;

a second capacitor, having a first end and a second end;

a second operational amplifier, having a non-inverting input node, an inverting input node, and an output node, wherein the non-inverting input node of the second operational amplifier is arranged to receive a predetermined voltage, and the output node of the second operational amplifier is coupled to the inverting input node of the second operational amplifier;

a first switch circuit, having a first end and a second end, wherein the first end of the first switch circuit is coupled to the output node of the first operational amplifier, and the second end of the first switch circuit is coupled to the first end of the second capacitor;

a second switch circuit, having a first end and a second end, wherein the first end of the second switch circuit is coupled to the reference voltage, and the second end of the second switch circuit is coupled to the second end of the second capacitor;

a third switch circuit, having a first end and a second end, wherein the first end of the third switch circuit is coupled to the first end of the second capacitor, and the second end of the third switch circuit is arranged to output the second control voltage; and a fourth switch circuit, having a first end and a second end, wherein the first end of the fourth switch circuit is coupled to the second end of the second capacitor, and the second end of the fourth switch circuit is coupled to the output node of the second operational amplifier.

13. The PLL circuit of claim 12, wherein the first switch circuit and the second switch circuit are switched on during a first period and are switched off during a second period; the third switch circuit and the fourth switch circuit are switched on during the second period and are switched off during the first period; and the second period does not overlap the first period.

14. The PLL circuit of claim 12, wherein the voltage level shifter further comprises:

a third capacitor, having a first end and a second end, wherein the first end of the third capacitor is coupled to the second end of the third switch circuit, and the second end of the third capacitor is coupled to the reference voltage; and a fifth switch circuit, having a first end and a second end, wherein the first end of the fifth switch circuit is coupled to the first end of the third capacitor, and the second end of the fifth switch circuit is coupled to the output node of the loop filter.

15. The PLL circuit of claim 14, wherein the first switch circuit, the second switch circuit and the fifth switch circuit are switched on during a first period and are switched off during a second period; the third switch circuit and the fourth switch circuit are switched on during the second period and are switched off during the first period; and the second period does not overlap the first period.

16. The PLL circuit of claim 9, wherein the loop filter circuit comprises:
- an operational amplifier, having a non-inverting input node, an inverting input node, and an output node, wherein the non-inverting input node is arranged to receive a predetermined voltage, the inverting input node is arranged to receive the CP output, and the output node is arranged to output the voltage output;
- a resistor, having a first end and a second end, wherein the first end of the resistor is coupled to the inverting input node of the operational amplifier;
- a first capacitor, having a first end and a second end, wherein the first end of the first capacitor is coupled to the second end of the resistor, and the second end of the first capacitor is coupled to the output node of the operational amplifier; and
- a second capacitor, having a first end and a second end, wherein the first end of the second capacitor is coupled to the inverting input node of the operational amplifier, and the second end of the second capacitor is coupled to the output node of the operational amplifier.

17. The PLL circuit of claim 9, wherein the controllable oscillator circuit comprises a ring oscillator.

* * * * *